United States Patent
Tohoku

(10) Patent No.: US 8,644,780 B2
(45) Date of Patent: Feb. 4, 2014

(54) GAIN CONTROL CIRCUIT, FM RECEIVER AND COMPUTER PROGRAM PRODUCT

(75) Inventor: Tadayoshi Tohoku, Osaka (JP)

(73) Assignee: Icom Incorporated, Osaka (JP)

(*) Notice: Subject to any disclaimer, the term of this patent is extended or adjusted under 35 U.S.C. 154(b) by 3 days.

(21) Appl. No.: 13/357,846

(22) Filed: Jan. 25, 2012

(65) Prior Publication Data
US 2013/0084819 A1    Apr. 4, 2013

(30) Foreign Application Priority Data
Sep. 29, 2011   (JP) .................................. 2011-213639

(51) Int. Cl.
*H04B 1/10* (2006.01)
*H04K 3/00* (2006.01)

(52) U.S. Cl.
USPC .......................... 455/212; 455/218; 455/234.1

(58) Field of Classification Search
USPC .................... 455/212, 218–225, 234.1–250.1
See application file for complete search history.

(56) References Cited

U.S. PATENT DOCUMENTS 3,036,211 A * 5/1962 Broadhead, Jr. et al. .. 455/243.1
4,216,430 A * 8/1980 Amazawa et al. ............ 455/219

FOREIGN PATENT DOCUMENTS

JP           8018468 A        1/1996

* cited by examiner

*Primary Examiner* — Lee Nguyen
(74) *Attorney, Agent, or Firm* — Robert P. Michal; Lucas & Mercanti, LLP

(57) ABSTRACT

The present invention provides a gain control circuit for an FM receiver that can reduce a reproduced audio output according to the magnitude of the noise component of an intended signal included in a received signal.
The gain control circuit of the present invention is constituted by a noise level measurement circuit 26 and a preamplifier 25. The noise level measurement circuit 26 measures a noise level in an audio signal Sa1 output from an FM detector 4 and outputs a control signal Sc corresponding to the noise level. The preamplifier 25 reduces an output according to a value of the control signal Sc. With the gain control circuit of the present invention, the volume of the speaker is reduced as the noise component in the audio signal Sa1 increases due to a decrease in received electric field strength, and therefore discomfort caused by unpleasant noise can be reduced.

9 Claims, 5 Drawing Sheets

GAIN CONTROL CIRCUIT, FM RECEIVER AND COMPUTER PROGRAM PRODUCT

CROSS-REFERENCE TO RELATED APPLICATION

This application is based upon and claims the benefit of priority under 35 USC 119 of Japanese Patent Application No. 2011-213639 filed on Sep. 29, 2011, the entire contents of which are incorporated herein by reference.

BACKGROUND OF THE INVENTION

1. Field of the Invention

The present invention relates to a gain control circuit that controls an audio output reproduced by an FM receiver according to the magnitude of a noise component, an FM receiver including such a gain control circuit, and a computer program product that implements a function of such a gain control circuit.

2. Description of Related Art

With an FM receiver, if a radio wave input into the antenna has a predetermined electric field strength or higher, an audio signal demodulated by the FM detector will be less influenced by pulse noise, fading and the like, and thus a high quality audio output with a high S/N ratio can be obtained.

However, the output level of the demodulated signal is constant irrespective of the received electric field strength. Accordingly, if the received radio wave is weak (or in other words, the electric field strength is low), the demodulated audio will be weak, and significant noise will occur in the audio output.

Conventionally, two methods have been used primarily as methods for reducing discomfort due to such unpleasant noise (see JP 8-18468A).

One is a method (hereinafter referred to as the "first method") in which an audio output from a speaker by a squelch circuit is cut off (see FIG. 4 and the corresponding description of the above-mentioned Patent Document). Specifically, only a noise component of a detected demodulated signal is amplified and rectified by a squelch amplifier, and when the amount of the noise component is large, a squelch switch is controlled to turn off an output of a preamplifier and cut off the audio output from the speaker so as to be silent.

The other is a method (hereinafter referred to as the "second method") in which a gain control circuit including an electric field strength detection means and a preamplifier is disposed on the output side of an FM detector (see FIG. 1 and the corresponding description of the above-mentioned Patent Document). Specifically, a control signal according to the electric field strength of a radio wave received by the electric field strength detection means is generated, and the output of the preamplifier is reduced according to the intensity of the control signal. If the electric field strength of the received radio wave is small, the output of the preamplifier will be small, as a result of which the noise level of reproduced audio decreases according to the electric field strength.

In the case where the above-described first method is used in an FM receiver for wireless communication, the squelch is slightly opened when radio wave propagation is poor or when the radio wave is weak due to the distance to communication partner being too far. In such a case, there is a problem in that the user has to listen to an intended signal amid significant noise until the squelch is operated.

In the case where the above-described second method is used, not only when the electric field strength of an intended signal included in the received signal is high, but also when the electric field strength of the intended signal is low and the noise component is large, it is determined that the electric field strength is high due to an increase in the power level of the noise component, and the reproduced audio including a large amount of noise component is output from the speaker. Conversely, when the electric field strength of the intended signal included in the received signal is low, there is a problem in that the reproduced audio output is reduced too much, irrespective of the magnitude of noise component.

BRIEF SUMMARY OF THE INVENTION

The present invention relates to an improvement of the second method that uses the gain control circuit from among the methods for reducing discomfort due to noise as described above, and it is an object of the present invention to provide a gain control circuit that can appropriately reduce a reproduced audio output according to the magnitude of the noise component of an intended signal.

A gain control circuit according to the present invention is constituted by a noise level measurement circuit and a preamplifier. The noise level measurement circuit measures the noise level in an audio signal output from an FM detector and outputs a control signal corresponding to the noise level. The preamplifier reduces the output according to a value of the control signal.

With the gain control circuit of the present invention, the output of the preamplifier is controlled according to the magnitude of the noise component in the demodulated signal rather than according to the electric field strength of the intended signal included in the received signal, and therefore it is possible to appropriately reduce a reproduced audio output according to the magnitude of the noise component, as a result of which discomfort caused by unpleasant noise can be reduced.

It is preferable that the noise level measurement circuit includes: a filter that extracts a noise component from the audio signal output from the FM detector; a pulse generator that outputs pulses when an output of the filter exceeds a predetermined value; and an integrator that integrates a train of pulses output from the pulse generator and generates the control signal.

These and other objects, features and advantages of the present invention will become more apparent upon reading of the following detailed description along with the accompanied drawings.

DETAILED DESCRIPTION OF THE INVENTION

Hereinafter, an FM receiver including a gain control circuit according to an embodiment of the present invention will be described below with reference to the drawings.

Configuration of FM Receiver

Figure 1:
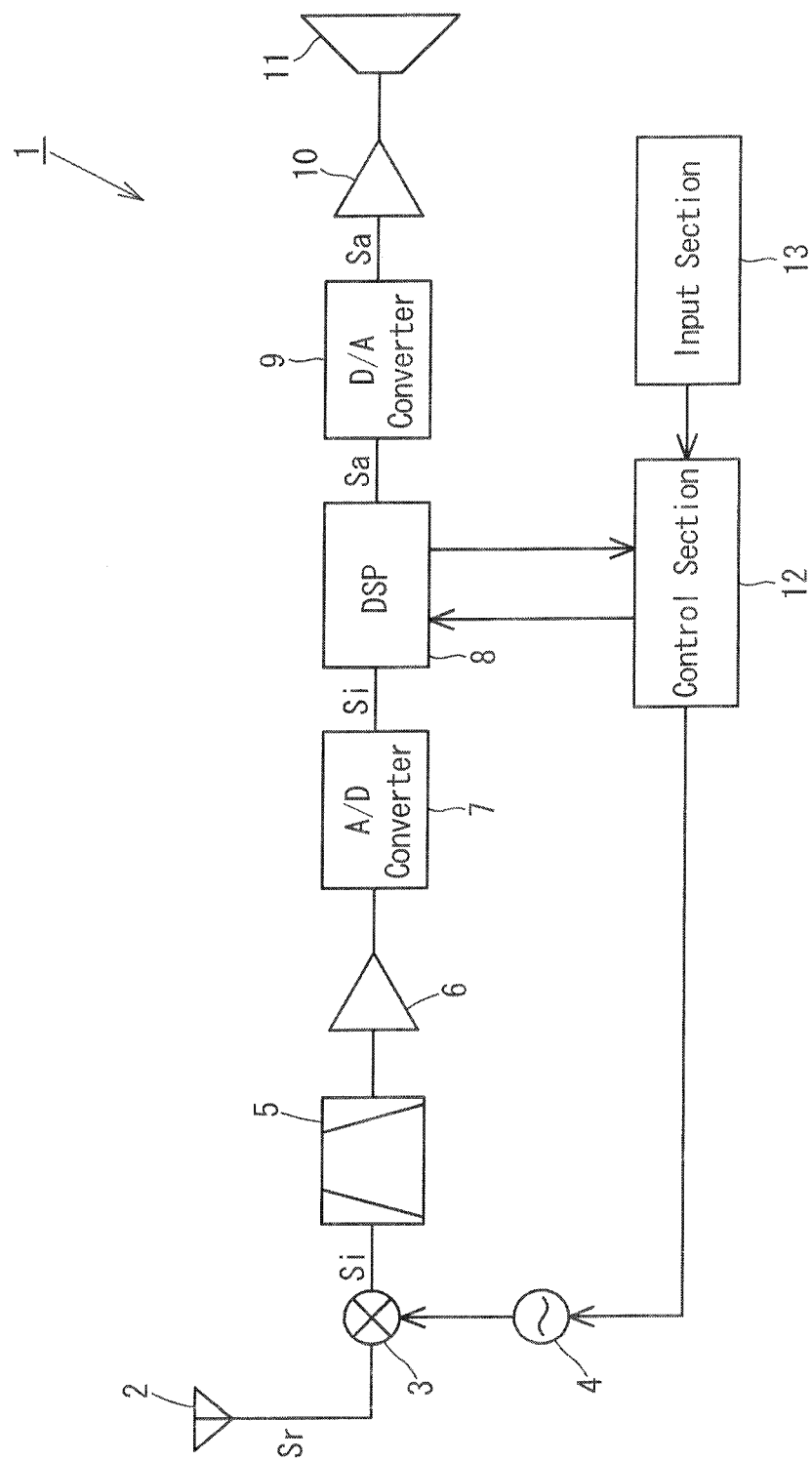
FIG. 1 is a block diagram showing a configuration of an FM receiver including a gain control circuit according to an embodiment of the present invention.

FIG. 1 shows a configuration of an FM receiver according to an embodiment of the present invention. An FM receiver 1 of the present embodiment includes an antenna 2, a mixer 3, a local oscillator 4, a roofing filter 5, an IF amplifier 6, an A/D converter 7, a digital signal processor (hereinafter referred to as a "DSP") 8, a D/A converter 9, an AF amplifier 10, a speaker 11, a control section 12, and an input section 13.

The mixer 3 synchronizes a high frequency signal Sr received by the antenna 2 with an output signal of the local oscillator 4, thereby extracting an intermediate frequency signal Si including an intended AF (audio frequency) signal. In the present embodiment, the intermediate frequency is set to 36 kHz.

The roofing filter 5 cuts high and low frequency components of the intermediate frequency signal Si output from the mixer 3 and causes only a component of a predetermined bandwidth to pass therethrough, so as to enable signal processing in the DSP 8 provided on the downstream side.

The IF amplifier 6 is an AGC (automatic gain control) amplifier, which performs amplitude limiting based on a level determining signal for determining an amplitude level of the intermediate frequency signal Si output from the DSP 8, and makes adjustment so that saturation does not occur in the intermediate frequency signal Si.

The A/D converter 7 converts the intermediate frequency signal Si output from the IF amplifier 6 to a digital signal so that the signal can be processed by the DSP 8. In the present embodiment, the conversion to a digital signal is performed by setting the sampling rate to 96 kHz.

The DSP 8 performs the following processing on the intermediate frequency signal Si that has been converted to a digital signal, based on a control signal input from the control section 12. Firstly, tuning for preventing interference is performed. Specifically, only a frequency component included in a predetermined bandwidth of the intermediate frequency signal Si is extracted with a filter. Secondly, the intermediate frequency signal Si that has been limited to a predetermined frequency bandwidth is subjected to frequency detection so as to demodulate an AF signal Sa. Thirdly, the AF signal Sa is subjected to various types of processing required to reproduce the audio. The configuration and functions of the DSP 8 will be described in detail later with reference to FIG. 2.

The D/A converter 9 converts the digital AF signal Sa demodulated by the DSP 8 to an analog AF signal. The AF amplifier 10 amplifies the analog AF signal Sa output from the D/A converter 9 to a level that can be output as audio by the speaker 11.

The control section 12 generates, based on a signal output from the DSP 8 and data input from the input section 13, a control signal for controlling operation of the DSP 8 and a control signal for controlling operation of the local oscillator 4. The control section 12 is usually constituted by a CPU, a RAM and a ROM. The input section 13 is constituted by a push button, a volume control and the like.

Configuration of DSP

Figure 2:
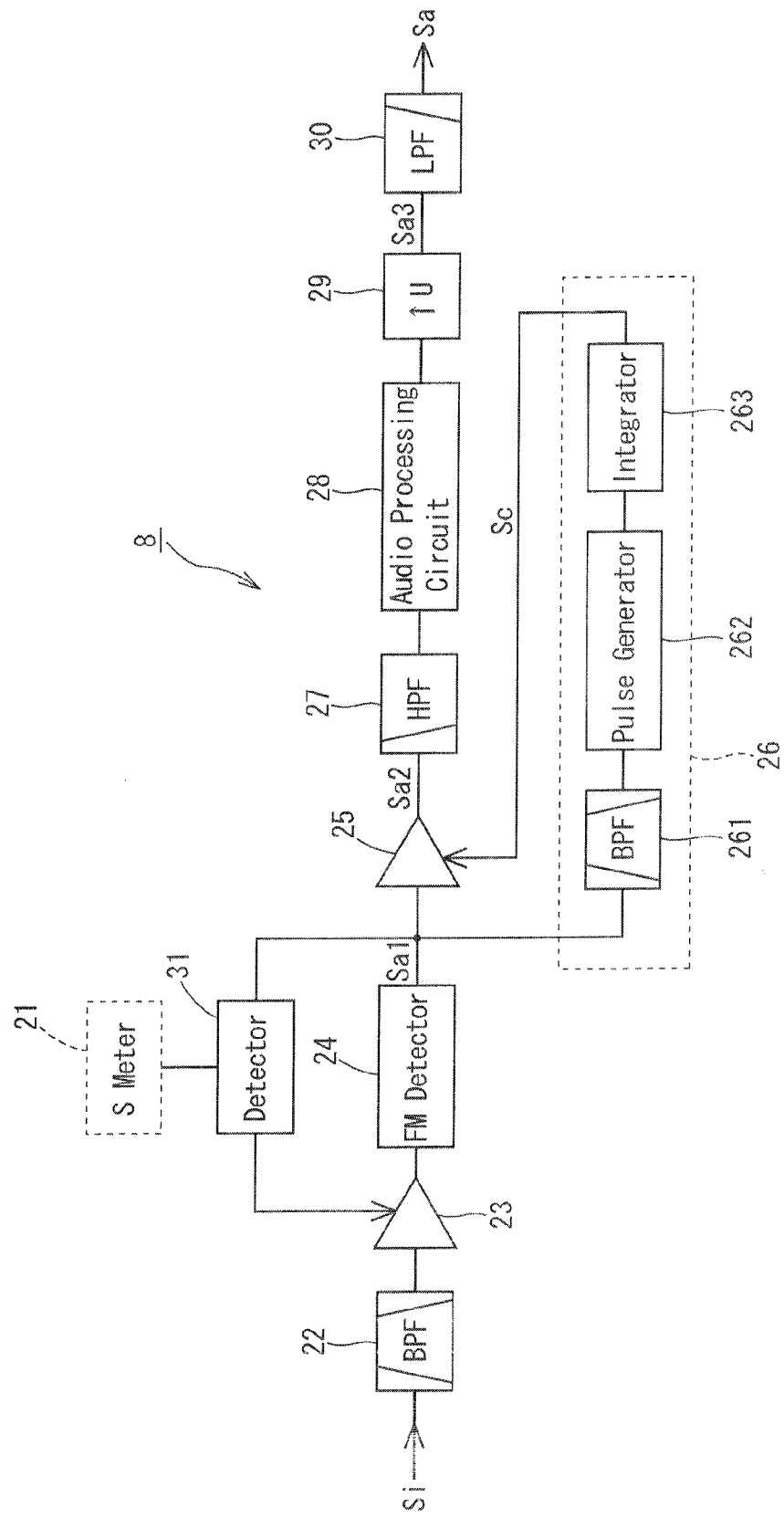
FIG. 2 is a block diagram showing various functions implemented by a DSP 8 shown in FIG. 1.

A description of the DSP 8 will be given next. FIG. 2 shows various functions implemented by the DSP 8 in blocks. The functions of the blocks shown in FIG. 2 excluding an S meter 21 indicated by a broken line are implemented by a program, stored in a RAM (not shown) provided inside the DSP 8, being executed. The digital intermediate frequency signal Si fed from the A/D converter 7 is sequentially received into a FIFO (first-in first-out) buffer (not shown). Then, the DSP 8 sequentially executes, on the received intermediate frequency signal Si, processing shown in each block of FIG. 2.

The DSP 8 includes a band-pass filter (hereinafter referred to as a "BPF") 22, an amplifier 23, an FM detector 24, a preamplifier 25, a noise level measurement circuit 26, a high-pass filter (hereinafter referred to as a "HPF") 27, an audio processing circuit 28, an upsampler 29 (indicated by ↑U in the diagram), a low-pass filter (hereinafter referred to as a "LPF") 30, and a detector 31. Among these blocks, the preamplifier 25 and the noise level measurement circuit 26 together constitute the gain control circuit of the present invention.

The functions of the respective blocks shown in FIG. 2 will be described. The intermediate frequency signal Si that has been converted to a digital signal by the A/D converter 7 is reduced in sampling rate by a downsampler (not shown) in order to secure a processing time for performing computation, and thereafter input into the BPF 22. Usually, the sampling rate is reduced from 96 kHz to 48 kHz by the downsampler, and in relation thereto, the intermediate frequency is converted from 36 kHz to 12 kHz.

The BPF 22 cuts high and low frequency components of the intermediate frequency signal Si and causes only a component of a predetermined bandwidth to pass therethrough, so that frequency detection in the FM detector 24 provided on the downstream side is properly performed.

The amplifier 23 is an AGC amplifier. The amplifier 23, together with the detector 31, constitutes an internal AGC circuit In order to stabilize the audio level reproduced from the speaker 11, the detector 31 detects an audio signal Sa1 output from the FM detector 24, generates a control signal according to the level of the audio signal, and inputs the control signal into the amplifier 23 so as to adjust the gain.

The FM detector 24 performs frequency detection on an output signal of the amplifier 23 and outputs the audio signal Sa1. The audio signal Sa1 output from the FM detector 24 is input into each of the preamplifier 25, the noise level measurement circuit 26 and the detector 31.

The S meter 21 that is external to the DSP 8 is for displaying the intensity of a received signal, and a value obtained as a result of detection of the audio signal Sa1 by the detector 31 is displayed on a liquid crystal display or the like.

Configuration and Operation of Gain Control Circuit

The configuration and operation of the gain control circuit will be described next. As mentioned above, the preamplifier 25 and the noise level measurement circuit 26 constitute the gain control circuit of the present invention. In the present invention, the noise level measurement circuit 26 extracts a noise component from the audio signal Sa1 that has undergone FM detection and controls the output of the preamplifier 25 according to the magnitude of the extracted noise component.

The noise level measurement circuit 26 includes a BPF 261, a pulse generator 262 and an integrator 263. A function of the noise level measurement circuit 26 will be described specifically with reference to the time chart shown in FIG. 3.

The BPF 261 extracts, from the audio signal Sa1 output from the FM detector 24, primarily a signal component of a bandwidth including a noise component. In the present embodiment, a BPF with a lower cut-off frequency of 4.3 kHz and a higher cut-off frequency of 8 kHz is used as the BPF 261.

Figure 3:
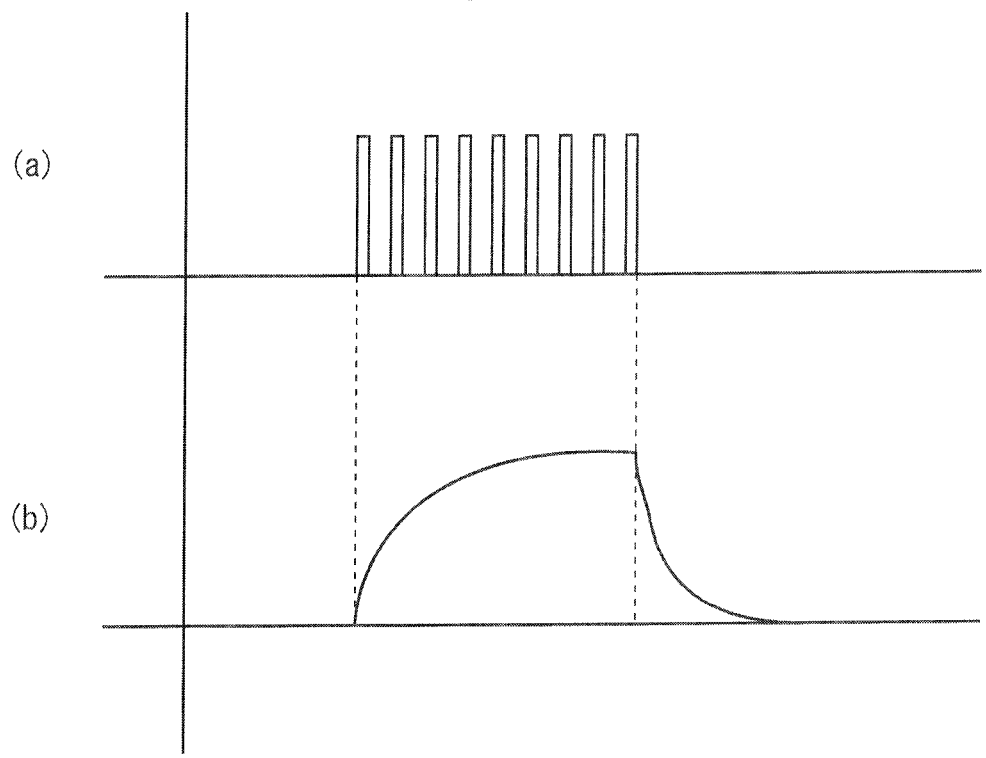
FIG. 3 is a time chart illustrating a function of a noise level measurement circuit.

The pulse generator 262 generates pulses at a predetermined time interval when the absolute value of the output of the BPF 261 exceeds a predetermined value. FIG. 3(*a*) shows an example of a train of pulses output from the pulse generator 262.

When the received radio wave is weak (the electric field strength is small), the noise level of the audio signal Sa1 output from the FM detector 24 becomes high, and therefore as shown in FIG. 3(*a*), pulses are generated continuously. A train of pulses generated by the pulse generator 262 is integrated by the integrator 263 to give a control signal Sc, and the control signal Sc is input into the preamplifier 25.

Figure 4:
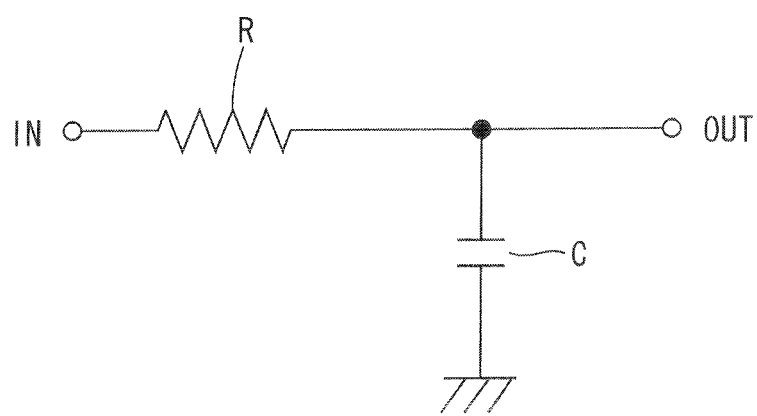
FIG. 4 is a circuit diagram showing an example of an integrator.

When, as the integrator 263, characteristics similar to those of an integrator circuit shown in FIG. 4, specifically, an integrator circuit in which a resistor R is connected in series to an input terminal (IN), and a capacitor C is connected in parallel to the same are implemented, the control signal Sc having the shape shown in FIG. 3(*b*) is obtained with the train of pulses shown in FIG. 3(*a*).

The value of the control signal Sc, or in other words, the output value of the integrator 263 can be adjusted by varying parameters for use in computation by the integrator 263. The parameter adjustment is performed by turning, for example, a volume control knob in the input section 13 (see FIG. 1). It may also be possible to, for example, provide an adjustment mode and set parameters by rotating a main dial during the adjustment mode.

When, as the integrator 263, characteristics similar to those of the integrator circuit shown in FIG. 4 are implemented, adjustment of the control signal can be performed with operational feeling similar to that when the capacitance of a variable capacitor C is varied using its knob, and therefore discomfort when adjustment is performed using the DSP can be eliminated.

Figure 5:
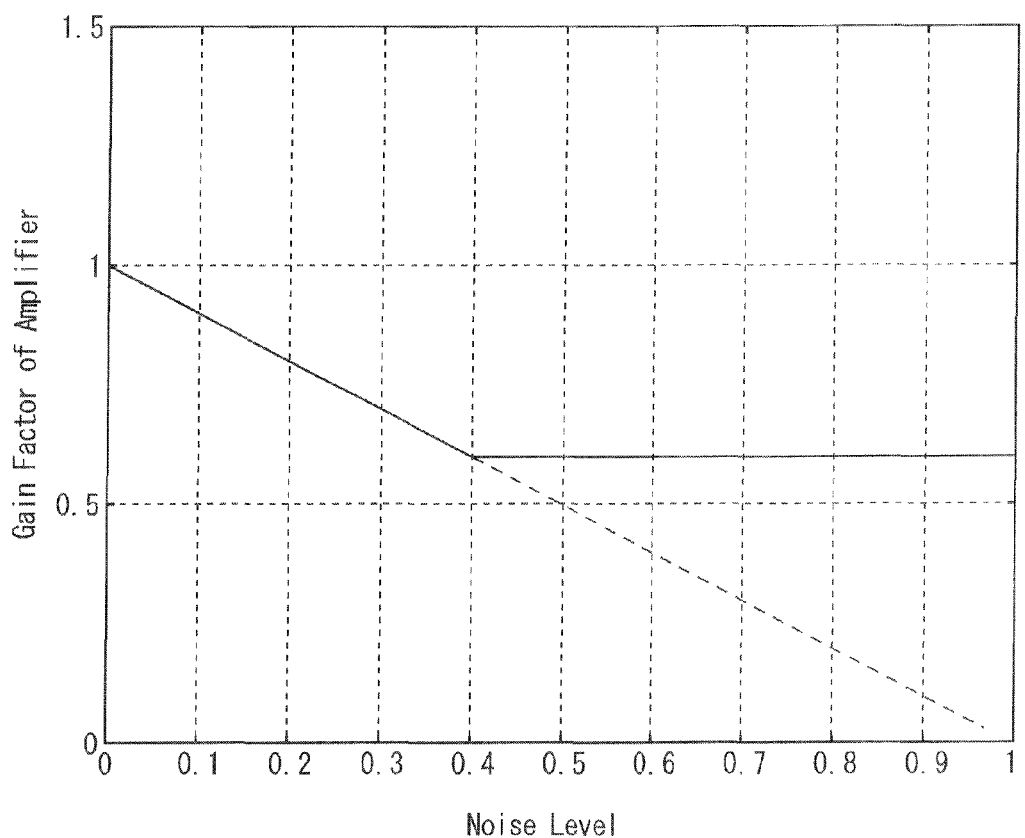
FIG. 5 is a graph showing a gain control curve of a preamplifier 25.

FIG. 5 shows a gain control curve of the preamplifier 25. The horizontal axis indicates the noise level (relative value) measured by the noise level measurement circuit 26 and the vertical axis indicates the gain factor of the preamplifier 25. The gain control curve of the preamplifier 25 is set such that the gain factor decreases as the noise level increases. Accordingly, the speaker volume decreases as the noise component included in the audio signal increases, as a result of which unpleasant noise is unnoticeable.

Referring to the gain control curve of the preamplifier 25 shown in FIG. 5, the gain factor of the preamplifier 25 remains constant when the noise level exceeds a threshold of 0.4. As indicated by to broken hue, when the gain factor of the preamplifier 25 is reduced as the noise level increases, the speaker volume is reduced and becomes silent as the noise level increases. In this case, the user of the FM receiver cannot determine whether the cause of the silent state is due to a breakdown of the FM receiver or due to an increase in the noise component, which may confuse the user.

In contrast, as shown in the gain control curve of FIG. 5, the gain factor of the amplifier remains constant when the noise level exceeds a predetermined value, and thus audio is constantly output from the speaker even though the volume of the audio is small. Accordingly, the user can make a distinction from the case where the FM receiver has been broken.

Figure 6A:
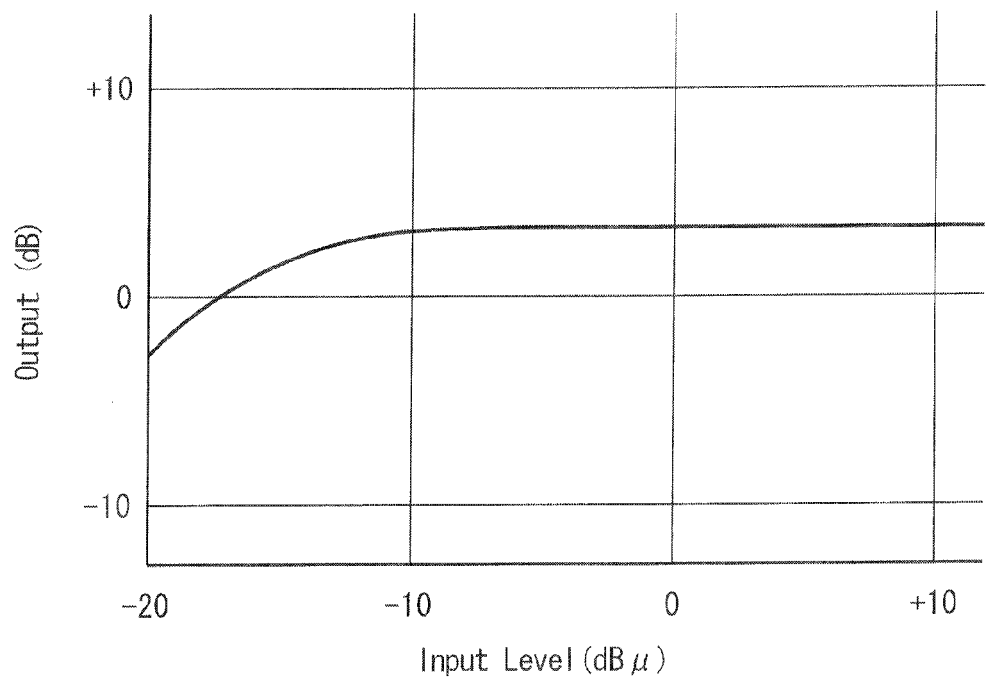
FIG. 6A is a graph showing input/output characteristics of an FM receiver including a gain control circuit according to the present invention.
Figure 6B:
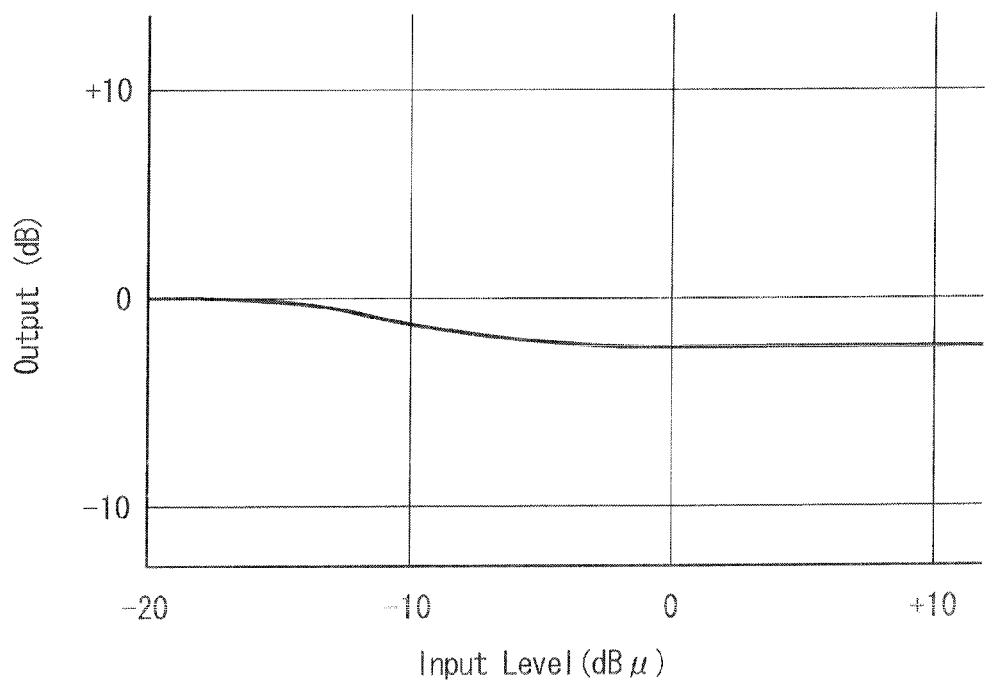
FIG. 6B is a graph showing input/output characteristics of an FM receiver without the gain control circuit.

FIG. 6A shows input/output characteristics of the FM receiver 1 of the present embodiment including the gain control circuit. For comparison, FIG. 6B shows input/output characteristics of an FM receiver without the gain control circuit. In these graphs, the horizontal axis indicates the level of the intermediate frequency signal Si input into the BPF 22, or in other words, a value corresponding to the received electric field strength, and the vertical axis indicates the intensity (relative value) of an audio signal Sa2 output from the preamplifier 25.

As shown in FIG. 6B, with the FM receiver without the gain control circuit, the audio signal output increases as the intended signal input level decreases (in other words, the received electric field strength decreases). This is due to an increase in noise included in the output signal. Accordingly, very unpleasant audio with noticeable noise will be reproduced from the speaker.

In contrast, as shown in FIG. 6A, with the FM receiver 1 of the present embodiment, an ideal curve has been obtained in which the audio signal output is reduced when the input level decreases (in other words, the received electric field strength decreases) and the noise level of the intended signal included in the received signal increases. That is, the speaker volume decreases as the noise component in the audio signal increases due to a decrease in the received electric field strength, and therefore discomfort caused by unpleasant noise can be reduced.

The configuration of the noise level measurement circuit 26 is not limited to that shown in FIG. 2. Any configuration can be used as long as a control signal for the preamplifier 25 can be generated by measuring the noise level in the audio signal Sa1 output from the FM detector 24.

Configuration of DSP (on Downstream Side)

Reverting to the description of FIG. 2, the configuration and operation of the blocks of the DSP 8 provided on the downstream side will be described. The audio signal Sa2 in which the output has been adjusted according to the noise component by the preamplifier 25 is input into the HPF 27. The HPF 27 attenuates a low component that is not regarded as an audio signal. In the present embodiment, a HPF with a lower cut-off frequency of 200 Hz is used.

The audio signal Sa2 from which the low component has been removed by the HPF 27 is input into the audio processing circuit 28, and subjected to various types of processing required to reproduce the audio.

The audio signal Sa2 output from the audio processing circuit 28 is input into the upsampler 29, where the sampling rate is converted from 48 kHz to 96 kHz to give an audio signal Sa3. The audio signal Sa3 is then set to have the initial sampling rate by the upsampler 29 because the audio signal Sa3 will be converted to an analog signal by the D/A converter 9 (see FIG. 1) designed to operate at a sampling rate of 96 kHz.

In order to reproduce the audio smoothly, a high frequency component is cut from the audio signal Sa3 output from the upsampler 29 by the LPF 30. In the present embodiment, the higher cut-off frequency of the LPF 30 is set to 3.5 kHz.

As shown in FIG. 1, the audio signal Sa output from the LPF 30 is converted to an analog signal by the D/A converter 9, amplified by the AF amplifier 10, and thereafter reproduced as audio from the speaker 11.

As described above, with the gain control circuit of the present invention, the output of the preamplifier is controlled according to the magnitude of the noise component in the demodulated audio signal, rather than according to the electric field strength of the intended signal included in the received signal, and therefore the reproduced audio output can be appropriately reduced according to the magnitude of noise.

In the embodiment described above, the gain control circuit function, specifically, the function for controlling an audio output to be reproduced by the FM receiver according to the magnitude of the noise component in the audio signal is implemented by the DSP performing computation based on the program, but the function may be implemented by a computer executing the program. Furthermore, it is needless to say that the function can be implemented by a circuit composed of a combination of an amplifier, a BPF, an integrator and the like.

The program for causing a computer to execute the function of the gain control circuit of the present invention may be recorded in a recording medium (DVD-ROM, for example) and distributed, or may be delivered over a network. The computer program is recorded and installed in a recording medium of the computer.

This application is based on Japanese patent application serial No. 2011-213639, filed in Japanese Patent Office on Sep. 29, 2011, the contents of which are hereby incorporated by reference.

Although the present invention has been fully described by way of example with reference to the accompanied drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A gain control circuit that controls an audio output reproduced by an FM receiver according to a magnitude of a noise component included in an audio signal, the gain control circuit comprising:
   a noise level measurement circuit that measures a noise level in an audio signal output from an FM detector and outputs a control signal corresponding to the noise level; and
   a preamplifier that reduces an output according to a value of the control signal,
   wherein the preamplifier reduces a gain as the value of the control signal increases and maintains the gain after the value of the control signal has exceeded a predetermined threshold value.

2. The gain control circuit according to claim 1, wherein the noise level measurement circuit comprises:
   a filter that extracts a noise component from the audio signal output from the FM detector;
   a pulse generator that outputs pulses when an output of the filter exceeds a predetermined value; and
   an integrator that integrates a train of pulses output from the pulse generator and generates the control signal.

3. The gain control circuit according to claim 1, wherein the FM detector, the preamplifier and the noise level measurement circuit are constituted by a digital signal processor, and respective functions thereof are implemented by the digital signal processor performing computation based on a program.

4. The gain control circuit according to claim 3, wherein the integrator implements characteristics similar to those of an integrator circuit including a resistor connected in series to an input terminal and a capacitor connected in parallel to the same.

5. An FM receiver that extracts a frequency-modulated audio signal from a high frequency signal that has been received by an antenna and reproduces the frequency-modulated audio signal as audio, the FM receiver comprising:
   a mixer that converts the high frequency signal received by the antenna to an intermediate frequency signal by mixing the high frequency signal with a local oscillator signal;
   an FM detector that detects the intermediate frequency signal output from the mixer and outputs an audio signal;
   a speaker that reproduces the audio signal output from the FM detector as the audio; and
   a gain control circuit that controls the audio output reproduced from the speaker according to a magnitude of a noise component included in the audio signal,
   wherein the gain control circuit comprises:
   a noise level measurement circuit that measures a noise level in the audio signal output from the FM detector and outputs a control signal corresponding to the noise level; and
   a preamplifier that reduces an output according to a value of the control signal,
   wherein the FM detector, the preamplifier and the noise level measurement circuit are constituted by a digital signal processor, and respective functions thereof are implemented by the digital signal processor performing computation based on a program.

6. The FM receiver according to claim 5, wherein the noise level measurement circuit comprises:
   a filter that extracts a noise component from the audio signal output from the FM detector;
   a pulse generator that outputs pulses when an output of the filter exceeds a predetermined value; and
   an integrator that integrates a train of pulses output from the pulse generator and generates the control signal.

7. The FM receiver according to claim 5, wherein the preamplifier reduces a gain as the value of the control signal increases and maintains the gain after the value of the control signal has exceeded a predetermined threshold value.

8. The FM receiver according to claim 5, wherein the integrator implements characteristics similar to those of an integrator circuit including a resistor connected in series to an input terminal and a capacitor connected in parallel to the same.

9. A non-transitory computer-readable storage medium comprising a set of computer-readable instructions stored thereon, which when executed by a processing system, causes the processing system to function as:
   a gain control circuit that controls an audio output reproduced by an FM receiver according to a magnitude of a noise component included in an audio signal
   a noise level measurement circuit that measures a noise level in an audio signal output from an FM detector and outputs a control signal corresponding to the noise level; and
   a preamplifier that reduces an output according to a value of the control signal,
   wherein the preamplifier function reduces a gain as the value of the control signal increases and maintains the gain after the value of the control signal has exceeded a predetermined threshold value.

* * * * *